United States Patent
Ono et al.

(10) Patent No.: US 6,359,035 B1
(45) Date of Patent: Mar. 19, 2002

(54) ADHESIVE FOR ELECTROLESS PLATING AND METHOD OF PRODUCING THE SAME

(75) Inventors: Yoshitaka Ono, Ibi-gun; Taki Adachi, Kyoto, both of (JP)

(73) Assignees: Ibiden Co., Ltd., Gifu; Sanyo Chemical Industries, Ltd., Kyoto, both of (JP)

( * ) Notice: Subject to any disclaimer, the term of this patent is extended or adjusted under 35 U.S.C. 154(b) by 0 days.

(21) Appl. No.: 09/509,554

(22) PCT Filed: Nov. 2, 1998

(86) PCT No.: PCT/JP98/04955

§ 371 Date: Apr. 13, 2000

§ 102(e) Date: Apr. 13, 2000

(30) Foreign Application Priority Data

Nov. 5, 1997 (JP) .............................................. 9-302557

(51) Int. Cl.[7] .................................................. C08K 3/11
(52) U.S. Cl. ........................ 523/339; 523/454; 523/456; 523/461
(58) Field of Search .................................. 523/461, 339, 523/454, 456; 156/330

(56) References Cited

U.S. PATENT DOCUMENTS 5,055,321 A   10/1991   Enomoto et al.
5,589,255 A * 12/1996   Enomoto ..................... 428/261

FOREIGN PATENT DOCUMENTS

| JP | 61276875 | 12/1986 |
|---|---|---|
| JP | 1-301775 | 12/1989 |
| JP | 2008283 | 1/1990 |
| JP | 2-188992 | 7/1990 |
| JP | 4-59814 | 2/1992 |
| JP | 5-29761 | 2/1993 |
| JP | 8-239640 | 9/1996 |
| JP | 9-208911 | 8/1997 |

OTHER PUBLICATIONS

Patent Abstract of Japan, Publication No.: 02008283.
Patent Abstract of Japan, Publication No.: 61276875.
Patent Abstract of Japan, Publication No.: 01301775.
Patent Abstract of Japan, Publication No.: 09208911.
Patent Abstract of Japan, Publication No.: 08239640.
Patent Abstract of Japan, Publication No.: 05029761.
Patent Abstract of Japan, Publication No.: 04059814.
Patent Abstract of Japan, Publication No.: 02188992.

* cited by examiner

*Primary Examiner*—Robert Dawson
*Assistant Examiner*—D. Aylward
(74) *Attorney, Agent, or Firm*—Greenblum & Bernstein, P.L.C.

(57) ABSTRACT

This adhesive for electroless plating can be produced without causing dust explosion and is excellent as an interlaminar resin insulating layer and is obtained by mixing an organic solvent dispersion of cured particles of heat resistant resin soluble or decomposable in an acid or an oxidizing agent with an uncured resin. The dispersion of the cured particles of the heat resistant resin in the organic solvent is obtained by dispersing cured particles formed in the production of heat resistant resin cured particles into the organic solvent without drying, and the uncured resin is a resin becoming hardly soluble in an acid or an oxidizing agent through curing treatment and capable of forming a heat resistant cured resin.

18 Claims, 4 Drawing Sheets

US 6,359,035 B1

ADHESIVE FOR ELECTROLESS PLATING AND METHOD OF PRODUCING THE SAME

BACKGROUND OF THE INVENTION

1. Field of the Invention

This invention relates to an adhesive for electroless plating and a method of producing the same, and more particularly to an adhesive for electroless plating, which does not cause accidents such as dust explosion and the like in the production and exhibits an excellent interlaminar insulating property when being applied to the production of multilayer printed wiring boards, as well as a method of producing the same.

2. Description of Background Information

Recently, the printed wiring board or the wiring board mounting LSI are demanded to have a high densification of pattern and an improved reliability in correspondence with the miniaturization and high performance of electron parts with the advance of electron industry. For this end, there are lately noticed additive method and semi-additive method wherein an adhesive is applied onto a surface of a substrate to form an adhesive layer and the surface of the adhesive layer is roughened and subjected to an electroless plating to from a conductor circuit as a method of forming the conductor circuit on a wiring board.

For example, the formation of the wiring board by the additive method has a characteristic that the wiring can be produced at a high density and a low cost with a high pattern accuracy as compared with an etched foil method (subtractive method) conducting the pattern formation through etching because the conductor circuit is formed by subjecting to the electroless plating after the formation of a resist.

As the adhesive used in the above electroless plating, there is disclosed a photosensitive adhesive for electroless plating obtained by dispersing fine powder of heat resistant resin into a photosensitive resin matrix in JP-A-61-276875, JP-A-2-188992, U.S. Pat. No. 5,055,321 and the like. When such an adhesive for electroless plating is used to produce a multilayer printed wiring board, there is adopted a method wherein the surface of the adhesive layer is roughened with an oxidizing agent to selectively dissolve and remove only the fine powder of the heat resistant resin and thereafter the roughened surface is subjected to an electroless plating treatment, whereby it is made possible to produce multilayer printed wiring boards having a high peel strength of conductor.

When the adhesive for electroless plating dispersing the heat resistant resin particles is produced by the well-known method, it is usual to mix the uncured resin matrix with the cured heat-resistant resin particles and knead them through three-rollers.

Since the heat resistant resin particles are powder form, they stir up in air during the production or in the handling such as transportation, mixing or the like, so that there is a risk of causing dust explosion.

Even if it is intended to directly mix the above finer powder with the heat resistant resin matrix, the particles themselves are aggregated due to drying, so that such aggregated particles can not completely be disentangled by kneading. If the aggregated particle remains in the adhesive layer for electroless plating, when the portion of the aggregated particle is dissolved and removed by the roughening treatment, a big hole is formed in the adhesive layer for electroless plating. Particularly, when such an adhesive layer for electroless plating is used as an interlaminar insulating layer having a big hole, there is caused a fatal problem that upperlayer conductor circuit and underlayer conductor circuit are electrically connected to each other by the electroless plating to bring about poor insulation.

It is, therefore, an object of the invention to propose an adhesive for electroless plating causing no accident such as dust explosion or the like in the production as well as a method of producing the same.

It is another object of the invention to propose an adhesive for electroless plating advantageously used for the production of additive or semi-additive multilayer printed wiring board having an interlaminar insulating property as well as a method of producing the same.

SUMMARY OF THE INVENTION

The inventors have made various studies in order to achieve the above objects and as a result, the invention has been accomplished as the following constructions.

That is, the adhesive for electroless plating according to the invention is an adhesive for electroless plating obtained by dispersing cured particles of heat resistant resin soluble or decomposable in an acid or an oxidizing agent into an organic solvent to form a dispersion and mixing with an uncured resin, characterized in that the dispersion of the cured particles of the heat resistant resin in the organic solvent is obtained by dispersing cured particles formed in the production of heat resistant resin cured particles into the organic solvent without drying, and the uncured resin is a resin becoming hardly soluble in an acid or an oxidizing agent through curing treatment and capable of forming a heat resistant cured resin.

And also, the production method of the adhesive for electroless plating according to the invention is characterized in that an aqueous dispersion of cured particles obtained in the production of heat resistant resin cured particles soluble or decomposable in an acid or an oxidizing agent is subjected to a solvent substitution with an organic solvent without drying, and the resulting organic solvent dispersion of the cured particles obtained by the substitution is mixed with an uncured resin becoming hardly soluble in an acid or an oxidizing agent and converting into a heat resistant cured resin through a curing treatment to obtain an adhesive for electroless plating having a structure that the cured particles of the heat resistant resin are dispersed into the uncured resin and the organic solvent.

Furthermore, the production method of the adhesive for electroless plating according to the invention is characterized in that an aqueous dispersion of cured particles obtained in the production of heat resistant resin cured particles soluble or decomposable in an acid or an oxidizing agent is subjected to a solvent substitution with an organic solvent without drying, and the resulting organic solvent dispersion of the cured particles obtained by the substitution is mixed with an uncured resin becoming hardly soluble in an acid or an oxidizing agent and converting into a heat resistant cured resin through a curing treatment and a heat resistant thermoplastic resin to obtain an adhesive for electroless plating having a structure that the cured particles of the heat resistant resin are dispersed into the uncured resin, the heat resistant thermoplastic resin and the organic solvent.

DETAILED DESCRIPTION OF PREFERRED EMBODIMENTS OF THE INVENTION

Figure 1:
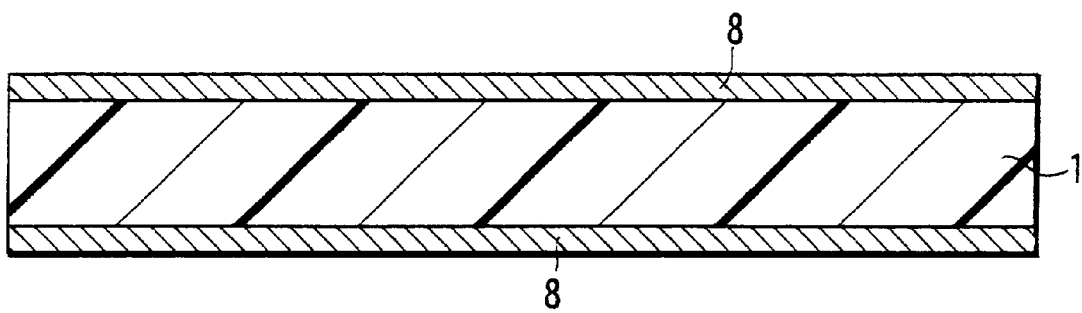
FIG. 1 is a diagrammatic view illustrating a part of production steps for the printed wiring board according to the invention.

The adhesive for electroless plating according to the invention is an adhesive for electroless plating having a structure that cured particles of heat resistant resin soluble or decomposable in an acid or an oxidizing agent are dispersed into a mixture of an uncured resin and an organic solvent, and has the following characteristics ①-③.

① By An adhesive is obtained by mixing an organic solvent dispersion of cured particles of heat resistant resin soluble or decomposable in an acid or an oxidizing agent with an uncured resin.

② An organic solvent dispersion is obtained by dispersing cured particles produced in the production of heat resistant resin cured particles into an organic solvent without drying.

③ An uncured resin becomes hardly soluble in an acid or an oxidizing agent through a curing treatment and has a formability of heat resistant cured resin.

Thus, in the adhesive according to the invention, the dispersion of cured particles of heat resistant resin in the organic solvent is mixed with the uncured resin, so that the particles are not aggregated with each other and hence there is no occurrence of hole communicating in the interlaminar resin insulating layer. Therefore, the upperlayer and underlayer conductor circuits are not electrically connected to each other even if electroless plating is carried out.

In the adhesive according to the invention, the cured particles obtained in the production of heat resistant resin cured particle are dispersed in the organic solvent without drying (as non-dried particles are) to form the organic solvent dispersion, so that it is possible to effectively prevent a risk of causing so-called dust explosion.

As a raw material for the cured particles of the heat resistant resin, epoxy resin is desirable, and particularly bisphenol A-type epoxy resin, bisphenol F-type epoxy resin and the like are suitable. In this place, the epoxy resin is an uncured polyepoxy compound.

As a curing agent for curing the epoxy resin, amine curing agent, acid anhydride curing agent and the like say be used. Because, the cured product obtained by reacting with such a curing agent can easily be decomposed by an acid or an oxidizing agent.

Moreover, there are suitably adaptable ones described in JP-A-4-59814 in detail as the amine curing agent. For example, it is desirable to select at least one selected from the group consisting of aliphatic polyamines, alicyclic or heterocyclic aliphatic polyamines, aromatic polyamines and polyamideamines.

As the acid anhydride curing agent, at least one of methyltetrahydrophthalic acid anhydride and methyl-hexahydrophthalic acid anhydride is desirable.

The production method of the adhesive according to the invention has the following features.

At first, the aqueous dispersion of cured particles obtained in the production of heat resistant resin cured particles dissolving or decomposing in the acid or oxidizing agent are subjected to solvent substitution with an organic solvent without drying. By such a solvent substitution is obtained a dispersion of the heat resistant resin cured particles in the organic solvent.

The thus obtained dispersion of the cured particles of the heat resistant resin in the organic solvent is mixed with an uncured resin becoming hardly soluble in the acid or oxidizing agent and being capable of forming a heat resistant cured resin through a curing treatment. As a result, there is obtained an adhesive for electroless plating wherein the cured particles of heat resistant resin soluble and decomposing in the acid or oxidizing agent are uniformly dispersed in the mixture of uncured resin and organic solvent.

In this case, the aqueous dispersion of the cured particles obtained in the production of heat resistant resin cured particles can be obtained, for example, by emulsion polymerization using the aforementioned epoxy resin and curing agent as a starting material. The thus obtained aqueous dispersion of the cured particles is favorable to be washed with, for example, an aqueous alkali solution for removing residual chlorine because it is used in an application relating to wiring board.

In the production method of the invention, the aqueous dispersion of the cured particles is characterized by subjecting to solvent substitution with an organic solvent to form a dispersion of the cured particles in the organic solvent without removing water through drying irrespectively of the presence or absence of the above washing step.

Then, ① emulsion polymerization step, ② washing step and ③ solvent substitution step will be described in detail.

① Emulsion Polymerization Step

In the preparation of the cured particles of the heat resistant resin, a solution comprising an epoxy resin of bisphenol A-type, F-type or the like, a curing agent and an emulsifying agent is first dispersed in a medium such as water or the like with stirring and heated to promote polymerization.

As the emulsifying agent used in the emulsion polymerization, a nonionic type surfactant is useful. As the nonionic type surfactant, it is desirable to use ethylene oxide addition product of at least one selected from higher alcohol, alkylphenol, higher alkylamine, aliphatic amide, fats and the like.

② Washing Step

The cured particles of the heat resistant resin obtained by the above polymerization reaction are separated through centrifugal treatment and washed. It is desirable that the thus obtained resin cured particles are subjected to a treatment of removing residual chlorine by boiling with an alkali aqueous solution such as sodium hydroxide, potassium hydroxide, or the like. Particularly, in case of the epoxy resin obtained by reacting a phenol such as bisphenol or the like with epichlorohydrine, organic chlorine retains in the epoxy resin, so that inorganic chlorine ion generates in the production of the cured particles of the epoxy resin. If the amount of residual chlorine becomes large, it causes copper migration in the use for the wiring board and forms a short-circuit between the wirings. Therefore, the above treatment is necessary for decreasing the amount of chlorine ion. Even after the treatment, the cured particles of the heat resistant resin are at a state of aqueous dispersion.

Moreover, silica colloid or the like may be added after the above washing step for preventing the aggregation of the resin particles.

③ Solvent Substitution Step

In the production of the adhesive for electroless plating, the solvent medium in the aqueous dispersion of the rein cured particles should be substituted from water to an organic solvent. Because the resin cured particles must be mixed with an uncured resin.

Such a substitution is carried out by utilizing the difference in a boiling point between water and the organic solvent. As the organic solvent, use may be made of a water miscible organic solvent such as N-methylpyrolidone (NMP), diethylneglycol dimethyl ether (DMDG), triethyleneglycol dimethyl ether (DMTG) or the like. These solvents are higher in the boiling point than water and can selectively remove water through boiling.

In the invention, a ratio of the resin cured particles to be dispersed in the organic solvent is optimum to be 10~70% by weight to the organic solvent. Because, when it is less than 10% by weight, the viscosity of the dispersion is low and the settling aggregation of the resin cured particles is easily caused, while when it exceeds 70% by weight, fine powder of slightly aggregated heat resistant particles starts to be formed and a risk of powder explosion increases.

The dispersion of the cured particles of the heat resistant resin in the organic solvent obtained by the above steps is mixed with the uncured resin to obtain an adhesive for electroless plating at a state of uniformly dispersing the cured particles of the heat resistant resin into the mixture of the uncured resin and the organic solvent. This mixing method is not restricted, but a method of mixing and kneading through three rollers is optimum.

In the invention, the uncured resin is a resin becoming hardly soluble in an acid or oxidizing agent through curing treatment and capable of forming heat-resistant cured resin. As the uncured resin having such a property, use may preferably be made of at least one thermosetting resin selected from epoxy resin, polyimide resin, phenolic resin and modified resin thereof. And also, these thermosetting resins may partly be substituted with a photosensitive group.

As the epoxy resin, it is favorable to use a resin obtained by curing cresol-novolac type epoxy resin or phenol-novolac type epoxy resin with an imidazole curing agent, or an alicyclic epoxy resin. Because, the cured products of these resins are hardly soluble in the acid or oxidizing agent and excellent in the resistance to base. That is, the electroless plating solution is strong base, so that the feature that the resin indicates the resistance to base is an essential factor as an adhesive for electroless plating. Moreover, there can be used epoxy acrylate obtained by reacting a part of epoxy group in the above epoxy resin with acrylic acid or methacrylic acid to introduce a photosensitive group thereinto.

The adhesive for electroless plating according to the invention may contain at least one heat resistant thermoplastic resin selected from polyether sulfone (PES), polyphenylene ether (PPE) and polyphenylene sulfide (PPES) together with the uncured resin, if necessary.

When the heat resistant thermoplastic resin is included, it may be mixed in the mixing of the dispersion of the heat resistant resin cured particles in the organic solvent with the uncured resin.

In the invention, as the cured particles of the heat resistant resin dispersed in the organic solvent, it is desirable to use ① heat resistant resin powder having an average particle size of not more than 10 $\mu$m, and ② a mixture of particles having a relatively large average particle size and particles having a relatively small average particle size. Because, the surface area of a roughened surface of an interlaminar insulating resin layer after the roughening increases to improve the adhesion property for the plated layer.

The aforementioned adhesive for electroless plating according to the invention may be applied onto a substrate as is uncured after the production thereof, or may be impregnated into a glass cloth and dried to form a B-stage prepreg, or may be applied to a base film such as polyethylene terephthalate, polypropylene or the like and dried to forma B-stage film. Further, it is possible to shape the adhesive into a substrate form.

The method of producing a printed wiring board by using the above adhesive for electroless plating according to the invention will be described below.

(1) As a substrate coating with the adhesive according to the invention, use may be made of a copper-clad laminate having a copper pattern formed by etching, a glass epoxy substrate, a polyimide substrate, a ceramic substrate, a metal substrate and the like. The adhesive layer for electroless plating is formed on the substrate and further the surface is roughened to form a roughened surface while an opening is formed on the adhesive layer, and then the roughened surface is subjected to electroless plating according to usual manner to form a copper pattern and via-holes likewise the conventional technique. Moreover, front and read wiring layers are electrically connected to each other by forming through-holes in the core substrate according to usual manner.

(2) Then, the adhesive layer for electroless plating according to the invention is formed on the substrate.

(3) Next, the adhesive layer for electroless plating on the substrate is dried and thereafter openings for the formation of via-holes are formed, if necessary. In this case, the opening portion for the via-hole is formed by light exposure and development when the adhesive is a photosensitive resin, and by laser working after thermosetting when it is a thermosetting resin.

(4) After the curing of the adhesive for electroless plating, the surface is subjected to a roughening treatment by dissolving and removing the heat resistant resin particles with an acid or oxidizing agent. As the acid, use may be made of phosphoric acid, hydrochloric acid, sulfuric acid or an organic acid such as formic acid, acetic acid or the like, but the organic acid is desirable because it hardly corrode the metal conductor layer exposed from the via-hole. As the oxidizing agent, chromic acid, permanganate (potassium permanganate or the like) are desirable.

(5) After the surface of the adhesive layer is roughened, a catalyst nucleus is applied thereto. As the catalyst nucleus, it is desirable to use a noble metal or a palladium colloid. In general, palladium chloride or palladium colloid is used. It is desirable to conduct heating treatment for fixing the catalyst nucleus. Moreover, palladium is favorable as a catalyst nucleus.

(6) Then, a plated resist is formed on the adhesive layer provided with the catalyst nucleus. As the plated resist, commercial available product can be used, but a mixture of an acrylate of cresol novolac or phenol novolac type epoxy resin and an imidazole curing agent is favorable.

(7) Next, a non-forming portion of the plated resist is subjected to electroless plating to form conductor circuits and via-holes. The above method is so-called full-additive method.

(8) In the invention, the full roughened surface is thinly subjected to electroless plating after the formation of the catalyst nucleus in the item (6) to form a plated resist and then there is adopted so-called semi-additive method wherein electrolytic plating is carried out to remove the plated resist and the thin electroless plated film existing beneath the plated resist is removed to form conductor circuit.

EXAMPLES

Example 1

A. Production of Cured Particles of the Heat Resistant Resin

① 50 parts by weight of ion exchanged water is successively dropped while stirring the mixture of 45 parts by weight of bisphenol type epoxy resin (produced by Mitsui Petroleum Chemicals, Ltd. Epomic R-140S) and 5 parts by weight of an emulsifying agent (additive product of 25 mol of ethylene oxide of cumylphenol modified with styrene) to obtain an emulsified product. Moreover, the average particle size of the emulsified product can be rendered into 1 μm by controlling the dropping temperature of the ion exchanged water to 40~41° C., and the average particle size of the above emulsified product can be rendered into 0.5 μm by controlling the dropping temperature to 19~21° C.

② To 50 parts by weight of the emulsified product are added 1.2 parts by weight of an emulsifying agent (additive of 30 mol of ethylene oxide of a higher aliphatic amine) and 2 parts by weight of an amine curing agent (ethylene diamine) and temperature is raised to 50~97° C. with stirring to conduct addition polymerization reaction through heating treatment, whereby there is obtained an aqueous dispersion of heat resistant resin cured particles. Moreover, the average particle size of the cured particles of the heat resistant resin is the same as that of the emulsified product.

③ After the completion of the reaction, the treatment of chlorine removal is carried out by neutralizing newly produced inorganic chlorine with an aqueous solution of 30% sodium hydroxide and washing with an ion exchanged water. The concentration of the heat resistant resin cured particles at each particle size is 55.2% by weight and 50.1% by weight.

④ After the treatment of chlorine removal, 21 parts by weight of colloidal silica (produced by Nissan Kagaku Co., Ltd. aqueous solution of 0.20% Snowtex) is added to 100 parts by weight of the cured particles of the heat resistant resin when the average particle size is 1 μm or 31 parts by weight is added when the average particle size is 0.5 μm.

B. Substitution of Solvent

Water used as a solvent is substituted with NMP (N-methylpyrolidone) as a diluent solvent of the adhesive for electroless plating. The substitution method is as follows.

① 80 parts by weight of NMP is added to 100 parts by weight of the aqueous dispersion of the cured particles of the heat resistant resin (average particle size 1 μm) after the treatment for chlorine removal, which are held at a temperature of 60~80° C. and a pressure of 10~50 Torr with stirring to distil off water and slight NMP. The thus NMP substituted solution has a solid concentration of 41.1% by weight and a water content of 0.1% by weight.

② 80 parts by weight of NMP is added to 100 parts by weight of the aqueous dispersion of the heat resistant resin cured particles (average particle size 0.5 μm) after the treatment for chlorine removal, which are held at a temperature of 60~80° C. and a pressure of 10~50 Torr with stirring to distil off water and slight NMP. The thus NMP substituted solution has a solid concentration of 36.2% by weight and a water content of 0.1% by weight.

C. Production of Upperlayer Adhesive for Electroless Plating

① 35 parts by weight of a 25% acrylated product of cresol-novolac type epoxy resin (produced by Nippon Kayaku Co., Ltd. molecular weight 2500), 3.15 parts by weight of a photosensitive monomer (produced by Toa Gosei Co., Ltd. Aronix M315), 0.5 part by weight of an antifoaming agent (produced by Sannopco Co., Ltd. S-65) and 3.6 parts by weight of NMP are mixed with stirring.

② 12 parts by weight of polyether sulfone (PES) (produced by BASF), 17.6 parts by weight of the dispersion of cured particles of the heat resistant resin of the item B (average particle size 1 μm) and 8.6 parts by weight of the dispersion of cured particles of the heat resistant resin of the item B (average particle size 0.5 μm) are mixed and further added with 14.1 parts by weight of NMP.

③ 2 parts by weight of an imidazole curing agent (produced by Shikoku Kasei Co., Ltd. 2E4MZ-CN), 2 parts by weight of a photoinitiator (produced by Ciba Geigy, Irgaque I-907), 0.2 part by weight of a photosensitizer (produced by Nippon Kayaku Co., Ltd. DETX-S) and 1.5 parts by weight of NMP are mixed with stirring.

They are mixed and kneaded through three rollers to obtain an adhesive for electroless plating C.

D. Production of Underlayer Adhesive for Electroless Plating

① 35 parts by weight of a 25% acrylated product of creasol-novolac type epoxy resin (produced by Nippon Kayaku Co., Ltd. molecular weight 2500), 4 parts by weight of a photosensitive monomer (produced by Toa Gosei Co., Ltd. Aronix M315), 0.5 part by weight of an antifoaming agent (produced by Sannopco Co., Ltd. S-65) and 3.6 parts by weight of NMP are mixed with stirring.

② 12 parts by weight of polyether sulfone (PES) (produced by BASF) and 40.0 parts by weight of the dispersion of cured particles of the heat resistant resin of the item B (average particle size 0.5 μm) are mixed and further added with 4.5 parts by weight of NMP, which are mixed with stirring.

③ 2 parts by weight of an imidazole curing agent (produced by Shikoku Kasei Co., Ltd. 2E4MZ-CN), 2 parts by weight of a photoinitiator (produced by Ciba Geigy Irgaque I-907), 0.2 part by weight of a photosensitizer (produced by Nippon Kayaku Co., Ltd. DETX-S) and 1.5 parts by weight of NMP are mixed with stirring.

They are kneaded to obtain an underlayer adhesive for electroless plating D.

E. Production of Printed Wiring Board (Semi-additive Method)

(1) A copper-clad laminate formed by laminating copper foils 8 onto both surfaces of a substrate 1 is used as a starting material (see FIG. 1). Firstly, the substrate 1 made of the copper-clad laminate is drilled and a plated resist is formed thereon, which is then subjected to an electroless plating to form a through-hole 9 and further the copper foils 8 are etched into a given patterns according to usual manner to form innerlayer conductor circuits 4 on both surfaces of the substrate 1.

Figure 2:
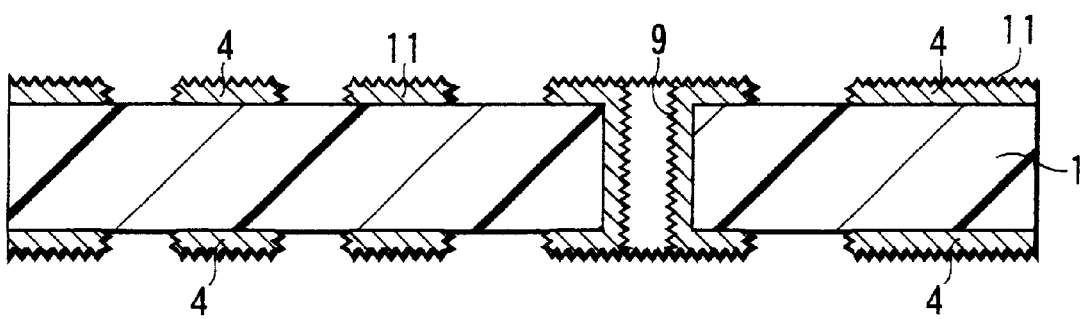
FIG. 2 is a diagrammatic view illustrating a part of production steps for the printed wiring board according to the invention.

(2) The substrate 1 provided with the innerlayer conductor circuits 4 is washed with water, dried and etched to form a roughened layer 11 (see FIG. 2).

Figure 3:
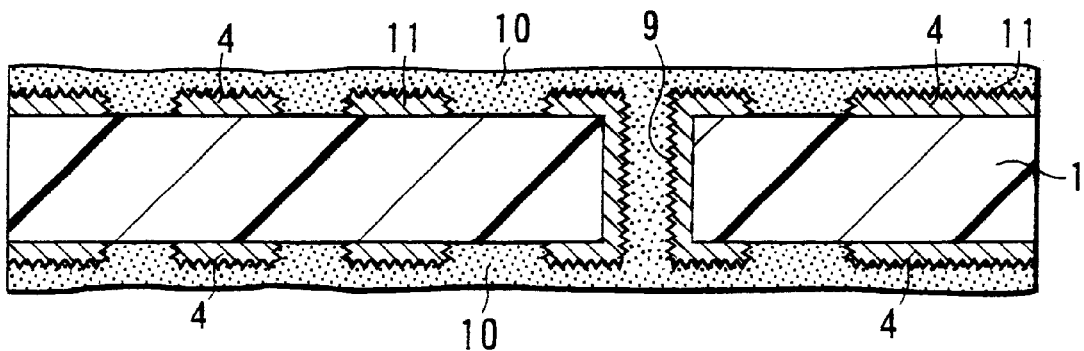
FIG. 3 is a diagrammatic view illustrating a part of production steps for the printed wiring board according to the invention.

(3) A resin filler 10 is applied by means of a roll coater and cured by heating treatment. That is, the resin filler 10 is filled between the innerlayer conductor circuits 4 or in the through-hole 9 at this step (see FIG. 3).

Figure 4:
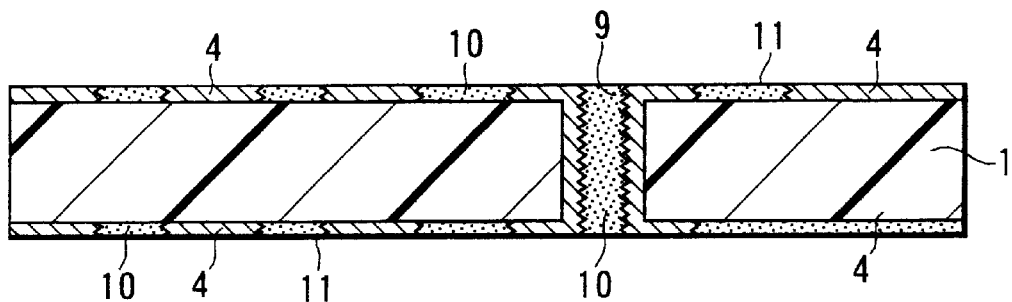
FIG. 4 is a diagrammatic view illustrating a part of production steps for the printed wiring board according to the invention.

(4) Both surfaces of the substrate 1 are polished so as not to leave the resin filler 10 on the surface of the innerlayer copper pattern 4 and an upper surface of a land for the through-hole 9 (see FIG. 4).

Figure 5:
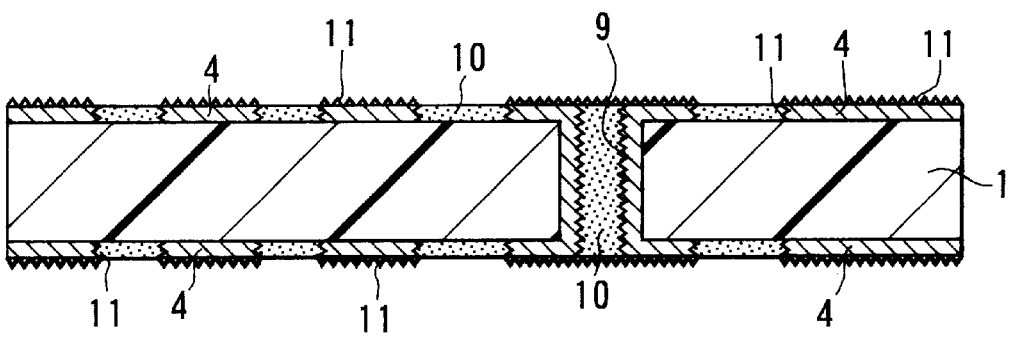
FIG. 5 is a diagrammatic view illustrating a part of production steps for the printed wiring board according to the invention.

Further, Cu—Ni—P alloy roughened layer 11 is formed on the exposed conductor circuits 4 and the upper land surface for the through-hole 9 with an electroless plating solution of Interplate, trade name (produced by Ebara Youd-ierite Co., Ltd.)(see FIG. 5).

Figure 6:
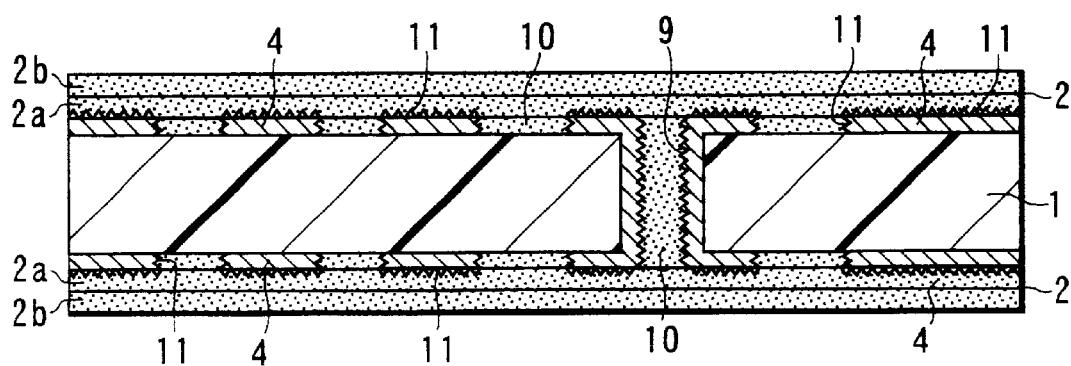
FIG. 6 is a diagrammatic view illustrating a part of production steps for the printed wiring board according to the invention.

(5) The underlayer adhesive D for electroless plating is applied onto both surfaces of the substrate 1 by means of a roll coater and dried at 60° C. for 30 minutes, and further the upperlayer adhesive C for electroless plating is applied by means of a roll coater, left to stand at a horizontal state for 20 minutes and dried at 60° C. for 30 minutes to form an interlaminar resin insulating layer 2 having a thickness of 40 μm and comprised of an insulating agent layer 2a and an adhesive layer 2b (see FIG. 6).

Figure 7:
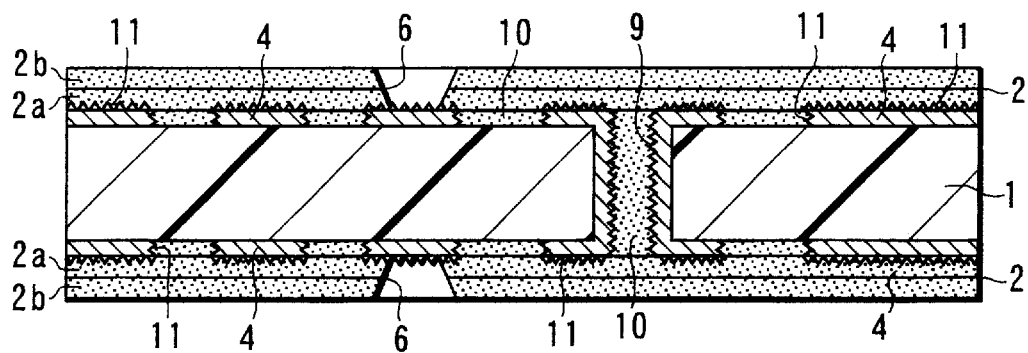
FIG. 7 is a diagrammatic view illustrating a part of production steps for the printed wiring board according to the invention.

(6) A photomask film printed with black circles is closed onto each surface of the substrate 1 provided with the interlaminar resin insulating layer 2 of the above item (5) and exposed to a super-high pressure mercury lamp. It is developed by spraying DMDG solution to form an opening 6 for via-hole in the interlaminar resin insulating layer 2. Further, the substrate 1 is exposed to a super-high pressure mercury lamp and subjected to a heating treatment at 100° C. for 1 hour and further at 150° C. for 5 hours to form the interlaminar resin insulating layer (adhesive layer) 2 of 35 μm in thickness having openings 6 (opening for the formation of via-hole) with an excellent dimension accuracy corresponding to the photomask (see FIG. 7).

Figure 8:
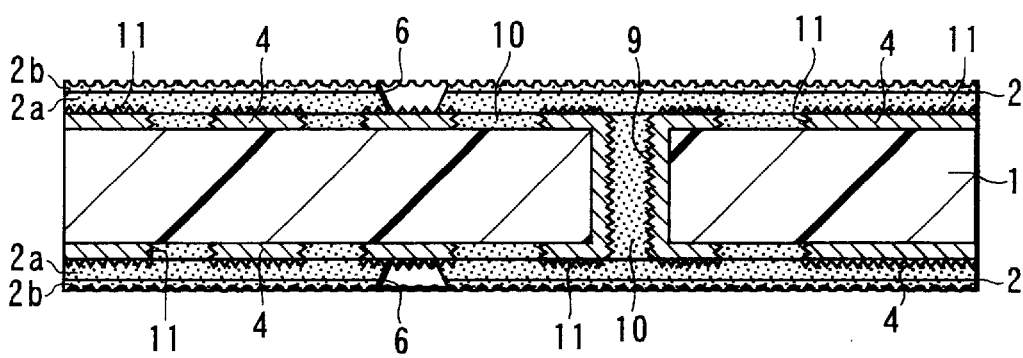
FIG. 8 is a diagrammatic view illustrating a part of production steps for the printed wiring board according to the invention.

(7) The substrate 1 subjected to the treatment of the item (6) is immersed in chromic acid for 1 minute to dissolve and remove epoxy resin particles on the surface of the interlaminar resin insulating layer 2 to thereby roughen the surface of the interlaminar resin insulating layer, which is then immersed in a neutral solution (produced by Shipley) and washed with water (see FIG. 8).

Further, a palladium catalyst (produced by Atotec Co., Ltd.) is applied onto the roughened surface of the substrate to form a catalyst nucleus on the surface of the interlaminar resin insulating layer and an inner wall surface of the opening for the via-hole.

Figure 9:
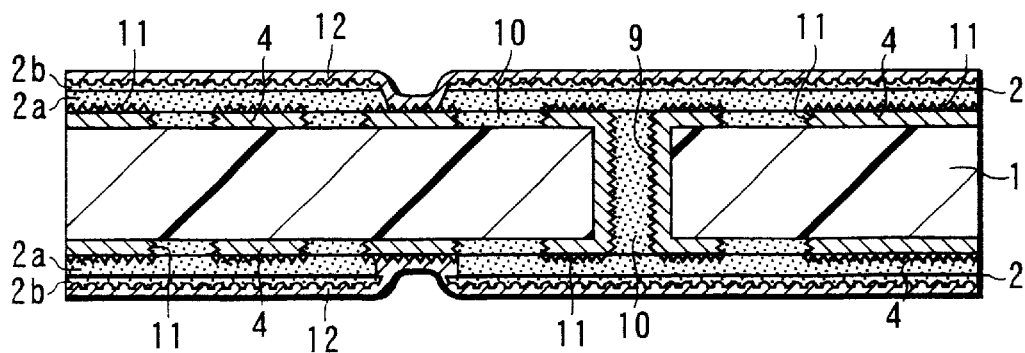
FIG. 9 is a diagrammatic view illustrating a part of production steps for the printed wiring board according to the invention.
Figure 10:
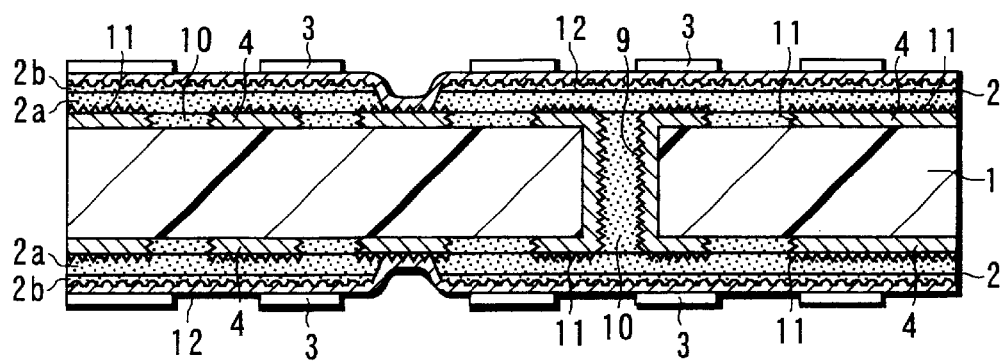
FIG. 10 is a diagrammatic view illustrating a part of production steps for the printed wiring board according to the invention.

(8) The substrate 1 is immersed in an electroless plating solution having the following composition to form an electroless copper plated film 12 on the whole of the roughened surface according to usual manner (see FIG. 9).

[Electroless Plating Solution]

| EDTA | 159 g/l |
|---|---|
| copper sulfate | 20 g/l |
| HCHO | 30 ml |
| NaOH | 40 g/l |
| α,α-bipyridyl | 80 g/l |
| PEG | 0.1 g/l |

[Electroless Plating Conditions]
liquid temperature of 70° C. for 30 minutes (9) A commercially available photosensitive dry film is attached onto the electroless copper plated film 12 and a mask film printed with a pattern is placed thereonto, which is exposed to a light and developed with sodium carbonate.

Figure 11:
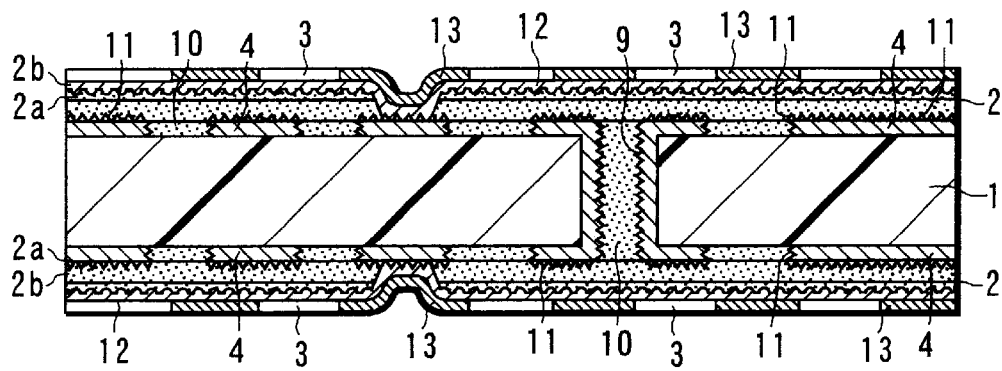
FIG. 11 is a diagrammatic view illustrating a part of production steps for the printed wiring board according to the invention.

(10) Then, it is subjected to an electrolytic copper plating according to usual manner to form an electrolytic copper plated film 13 (see FIG. 11).

Figure 12:
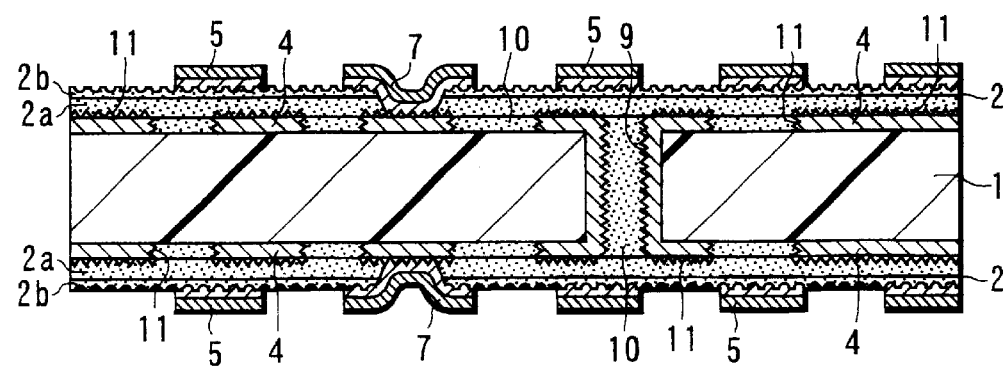
FIG. 12 is a diagrammatic view illustrating a part of production steps for the printed wiring board according to the invention.

(11) After the plated resist 3 is peeled and removed with an aqueous solution of KOH, the electroless plated film 12 beneath the plated resist 3 is dissolved and removed by etching with a mixed solution of sulfuric acid and hydrogen peroxide to form outerlayer conductor circuits 5 comprised of the electroless copper plated film 12 and the electrolytic copper plated film 13 (including the via-hole) (see FIG. 12).

Comparative Example 1

The same procedure as in Example 1 is fundamentally repeated except that the cured particles of the heat resistant resin after the production is dried to form powder, which is used to produce an adhesive for electroless plating as explained below.

(Production of Upperlayer Adhesive for Electroless Plating)

① 35 parts by weight of a 25% acrylated product of cresol-novolac type epoxy resin (produced by Nippon Kayaku Co., Ltd. molecular weight 2500), 3.15 parts by weight of a photosensitive monomer (produced by Toa Gosei Co., Ltd. Aronix M315), 0.5 part by weight of an antifoaming agent (produced by Sannopco Co., Ltd. S-65) and 3.6 parts by weight of NMP are mixed with stirring.

② 12 parts by weight of polyether sulfone (PES) (produced by BASF), 7.2 parts by weight of cured particles of the heat resistant resin (average particle size 1 μm) (produced by Sanyo Chemical Industries, Ltd. Polymapol SS-001) and 3.09 parts by weight of cured particles of the heat resistant resin (average particle size 0.5 μm) (produced by Sanyo Chemical Industries, Ltd. Polymapol S-50) are mixed and further added with 30 parts by weight of NMP with stirring.

③ 2 parts by weight of an imidazole curing agent (produced by Shikoku Kasei Co., Ltd. 2E4MZ-CN), 2 parts by weight of a photoinitiator (produced by Ciba Geigy, Irgaque I-907), 0.2 part by weight of a photosensitizer (produced by Nippon Kayaku Co., Ltd. DETX-S) and 1.5 parts by weight of NMP are mixed with stirring.

They are mixed and kneaded to obtain an upperlayer adhesive for electroless plating.

(Production of Underlayer Adhesive for Electroless Plating)

① 35 parts by weight of a 25% acrylated product of creasol-novolac type epoxy resin (produced by Nippon Kayaku Co., Ltd. molecular weight 2500), 4 parts by weight of a photosensitive monomer (produced by Toa Gosei Co., Ltd. Aronix M315), 0.5 part by weight of an antifoaming agent (produced by Sannopco Co., Ltd. S-65) and 3.6 parts by weight of NMP are mixed with stirring.

② 12 parts by weight of polyether sulfone (PES) (produced by BASF) and 14.49 parts by weight of cured particles of the heat resistant resin (average particle size 0.5 μm) (produced by Sanyo Chemical Industries, Ltd. Polymapol S-50) are mixed and further added with 30 parts by weight of NMP, which are mixed with stirring.

③ 2 parts by weight of an imidazole curing agent (produced by Shikoku Kasei Co., Ltd. 2E4MZ-CN), 2 parts by weight of a photoinitiator (produced by Ciba Geigy Irgaque I-907), 0.2 part by weight of a photosensitizer (produced by Nippon Kayaku Co., Ltd. DETX-S) and 1.5 parts by weight of NMP are mixed with stirring.

They are mixed and kneaded to obtain an underlayer adhesive for electroless plating.

With respect to 100 wiring boards obtained in the example and the comparative example are measured the ratio of generating interlaminar shortcircuit through a checker and the ratio of generating shortcircuit after they are left to stand for 200 hours under conditions that a temperature is 135° C., a relative humidity is 85% and a bias voltage is 3.3 V.

As a result, the ratio of generating interlaminar shortcircuit through the checker is 24.4% in the example and 46.6% in the comparative example.

And also, the ratio of generating shortcircuit after the leaving under high temperature and high humidity conditions is zero in the example and 32% in the comparative example.

Further, the dried powder is not existent at the steps in the example, so that there is no risk of dust explosion.

The reason why the ratio of generating the interlaminar shortcircuit decreases is considered due to the fact that the particles are not aggregated because they are not dried. And also, the reason why the ratio of generating shortcircuit in case of leaving under high temperature and high humidity conditions is not clear, but is considered due to the fact that since there is no large aggregated particle in the example, a path of penetrating water through the interface between the matrix resin and the particle becomes long and the inorganic chlorine ion produced in the production of the heat resistant resin cured particles is decreased.

As mentioned above, the adhesive for electroless plating according to the invention is used for the manufacture of printed wiring boards and does not fear the dust explosion in the manufacture thereof and indicates an excellent interlaminar insulating property in case of using as an interlaminar resin insulating material for a multi-layer printed wiring board, so that it is advantageous to manufacture multi-layer printed wiring boards with a high accuracy. Furthermore, according to the invention, the ratio of generating shortcircuit in case of leaving under high temperature and high humidity conditions can be decreased, so that wiring boards hardly causing poor inferiority due to the shortcircuit can be manufactured cheaply and in a higher yield.

What is claimed is:

1. An adhesive for electroless plating obtained by dispersing cured particles of heat resistant resin soluble or decomposable in an acid or an oxidizing agent into an organic solvent to form a dispersion and mixing with an uncured resin, characterized in that the dispersion of the cured particles of the heat resistant resin in the organic solvent is obtained by dispersing cured particles formed in the production of heat resistant resin cured particles into the organic solvent without drying, and the uncured resin is a resin becoming hardly soluble in an acid or an oxidizing agent through curing treatment and capable of forming a heat resistant cured resin.

2. An adhesive for electroless plating according to claim 1, wherein the dispersion of the cured particles of the heat resistant resin in the organic solvent is obtained by subjecting an aqueous dispersion of cured particles formed in the production of heat resistant resin cured particles to solvent substitution without drying to form an organic solvent dispersion.

3. An adhesive for electroless plating according to claim 1, wherein the cured particles of the heat resistant resin are cured particles of epoxy resin.

4. An adhesive for electroless plating according to claim 1, wherein the uncured resin is at least one thermosetting resin selected from epoxy resin, polyimide resin, phenolic resin and modified resin thereof.

5. An adhesive for electroless plating obtained by dispersing cured particles of heat resistant resin soluble or decomposable in an acid or an oxidizing agent into an organic solvent to form a dispersion and mixing with an uncured resin and a heat resistant thermoplastic resin, characterized in that the dispersion of the cured particles of the heat resistant resin in the organic solvent is obtained by dispersing cured particles formed in the production of heat resistant resin cured particles into the organic solvent without drying, and the uncured resin is a resin becoming hardly soluble in an acid or an oxidizing agent through curing treatment and capable of forming a heat resistant cured resin.

6. An adhesive for electroless plating according to claim 5, wherein the dispersion of the cured particles of the heat resistant resin in the organic solvent is obtained by subjecting an aqueous dispersion of cured particles formed in the production of heat resistant resin cured particles to solvent substitution without drying to form an organic solvent dispersion.

7. An adhesive for electroless plating according to claim 5, wherein the cured particles of the heat resistant resin are cured particles of epoxy resin.

8. An adhesive for electroless plating according to claim 5, wherein the uncured resin is at least one thermosetting resin selected from epoxy resin, polyimide resin, phenolic resin and modified resin thereof.

9. An adhesive for electroless plating according to claim 5, wherein the heat resistant thermoplastic resin is at least one resin selected from polyether sulfone, polyphenylene other and polyphenylene sulfide.

10. A method of producing an adhesive for electroless plating, characterized in that an aqueous dispersion of cured particles obtained in the production of heat resistant resin cured particles soluble or decomposable in an acid or an oxidizing agent is subjected to a solvent substitution with an organic solvent without drying, and the resulting organic solvent dispersion of the cured particles obtained by the substitution is mixed with an uncured resin becoming hardly soluble in an acid or an oxidizing agent and converting into a heat resistant cured resin through a curing treatment to obtain an adhesive for electroless plating having a structure that the cured particles of the heat resistant resin are dispersed into the uncured resin and the organic solvent.

11. The method of producing an adhesive for electroless plating according to claim 10, wherein the dispersion of the cured particles of the heat resistant resin in the organic solvent is obtained by subjecting an aqueous dispersion of cured particles formed in the production of heat resistant resin cured particles to solvent substitution without drying to form an organic solvent dispersion.

12. The method of producing an adhesive for electroless plating according to claim 10, wherein the cured particles of the heat resistant resin are cured particles of epoxy resin.

13. The method of producing an adhesive for electroless plating according to claim 10, wherein the uncured resin is at least one thermosetting resin selected from epoxy resin, polyimide resin, phenolic resin and modified resin thereof.

14. A method of producing an adhesive for electroless plating, characterized in that an aqueous dispersion of cured particles obtained in the production of heat resistant resin cured particles soluble or decomposable in an acid or an oxidizing agent is subjected to a solvent substitution with an organic solvent without drying, and the resulting organic solvent dispersion of the cured particles obtained by the substitution is mixed with an uncured resin becoming hardly soluble in an acid or an oxidizing agent and converting into a heat resistant cured resin through a curing treatment and a heat resistant thermoplastic resin to obtain an adhesive for electroless plating having a structure that the cured particles of the heat resistant resin are dispersed into the uncured resin, the heat resistant thermoplastic resin and the organic solvent.

15. The method of producing an adhesive for electroless plating according to claim 14, wherein the dispersion of the cured particles of the heat resistant resin in the organic solvent is obtained by subjecting an aqueous dispersion of cured particles formed in the production of heat resistant resin cured particles to solvent substitution without drying to form an organic solvent dispersion.

16. The method of producing an adhesive for electroless plating according to claim 14, wherein the cured particles of the heat resistant resin are cured particles of epoxy resin.

17. The method of producing an adhesive for electroless plating according to claim 14, wherein the uncured resin is at least one thermosetting resin selected from epoxy resin, polyimide resin, phenolic resin and modified resin thereof.

18. The method of producing an adhesive for electroless plating according to claim 14, wherein the heat resistant thermoplastic resin is at least one resin selected from polyether sulfone, polyphenylene ether and polyphenylene sulfide.

* * * * *

UNITED STATES PATENT AND TRADEMARK OFFICE
CERTIFICATE OF CORRECTION

PATENT NO.    : 6,359,035 B1  
DATED         : March 19, 2002  
INVENTOR(S)   : Y. Ono et al.

It is certified that error appears in the above-identified patent and that said Letters Patent is hereby corrected as shown below:

<u>Column 12,</u>
Line 42, "other" should be -- ether --.

Signed and Sealed this

Twenty-eighth Day of January, 2003

JAMES E. ROGAN
*Director of the United States Patent and Trademark Office*